United States Patent
Colombo et al.

(10) Patent No.: US 7,067,434 B2
(45) Date of Patent: Jun. 27, 2006

(54) HYDROGEN FREE INTEGRATION OF HIGH-K GATE DIELECTRICS

(75) Inventors: Luigi Colombo, Dallas, TX (US); James J. Chambers, Dallas, TX (US); Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 201 days.

(21) Appl. No.: 10/745,449

(22) Filed: Dec. 22, 2003

(65) Prior Publication Data

US 2005/0136679 A1 Jun. 23, 2005

(51) Int. Cl.
   *H01L 21/302* (2006.01)

(52) U.S. Cl. .............. 438/714; 438/723; 438/724; 438/788; 438/792; 438/910; 438/954

(58) Field of Classification Search .......... 438/696, 438/723, 724, 714, 756, 757, 751, 787, 788, 438/791, 792, 910, 954
   See application file for complete search history.

(56) References Cited

U.S. PATENT DOCUMENTS

| 4,481,229 | A   |   | 11/1984 | Suzuki et al. |         |
|-----------|-----|---|---------|---------------|---------|
| 5,162,892 | A   |   | 11/1992 | Hayashi et al.|         |
| 5,750,211 | A   |   | 5/1998  | Weise et al.  |         |
| 6,303,512 | B1  | * | 10/2001 | Laermer et al.| 438/712 |
| 6,485,988 | B1  | * | 11/2002 | Ma et al.     | 438/3   |
| 6,620,713 | B1  |   | 9/2003  | Arghavani et al.|       |

* cited by examiner

*Primary Examiner*—George A. Goudreau
(74) *Attorney, Agent, or Firm*—Peter K. McLarty; W. James Brady, III; Frederick J. Telecky, Jr.

(57) ABSTRACT

The present invention pertains to forming a transistor in the absence of hydrogen, or in the presence of a significantly reduced amount of hydrogen. In this manner, a high-k material can be utilized to form a gate dielectric layer in the transistor and facilitate device scaling while mitigating defects that can be introduced into the high-k material by the presence of hydrogen and/or hydrogen containing compounds.

24 Claims, 9 Drawing Sheets

HYDROGEN FREE INTEGRATION OF HIGH-K GATE DIELECTRICS

RELATED APPLICATIONS

This application is related to U.S. Patent Publication 20050136580, filed on Dec. 22, 2003, entitled HYDROGEN FREE FORMATION OF GATE ELECTRODES, wherein the entirety of this application is hereby incorporated by reference as if fully set forth herein.

FIELD OF INVENTION

The present invention relates generally to semiconductor processing, and more particularly to fabricating semiconductor devices employing high-k dielectric materials in the absence of or in a significantly reduced amount of hydrogen and/or hydrogen containing compounds.

BACKGROUND OF THE INVENTION

Field effect transistors (FETs) are widely used in the electronics industry for switching, amplification, filtering, and/or other tasks related to both analog and digital electrical signals. Most common among these are MOSFETs, wherein a metal or (doped) polysilicon gate contact or electrode is energized to create an electric field in an underlying channel region of a semiconductor body, by which current is allowed to conduct between a source region and a drain region of the semiconductor body.

The source and drain regions are typically formed by adding dopants to targeted regions on either side of the channel region in a semiconductor substrate. A gate dielectric or gate oxide, such as silicon dioxide ($SiO_2$), is formed over the channel region to physically separate the gate electrode from the substrate, and more particularly the channel region. A patterned gate electrode and gate dielectric is commonly referred to as a gate structure or stack.

The gate dielectric has electrically insulative properties and, as such, serves to retard the flow of large electrical currents between the gate electrode and the source/drain regions or channel of the substrate when a voltage is applied to the gate contact. The gate dielectric also serves to allow the applied gate voltage to set up an electric field in the channel region in a controllable manner.

A continuing trend in the manufacture of semiconductor products is toward a steady reduction in the size of electrical devices (known as scaling), together with improvements in device performance in terms of device switching speed, power consumption, reliability, etc. New materials and processes have been developed and employed in silicon processing technology to accommodate these requirements, including the ability to pattern and etch smaller device features. Recently, however, electrical and physical limitations have been reached in the thickness of gate dielectrics, particularly those formed of silicon dioxide.

Figure 1:
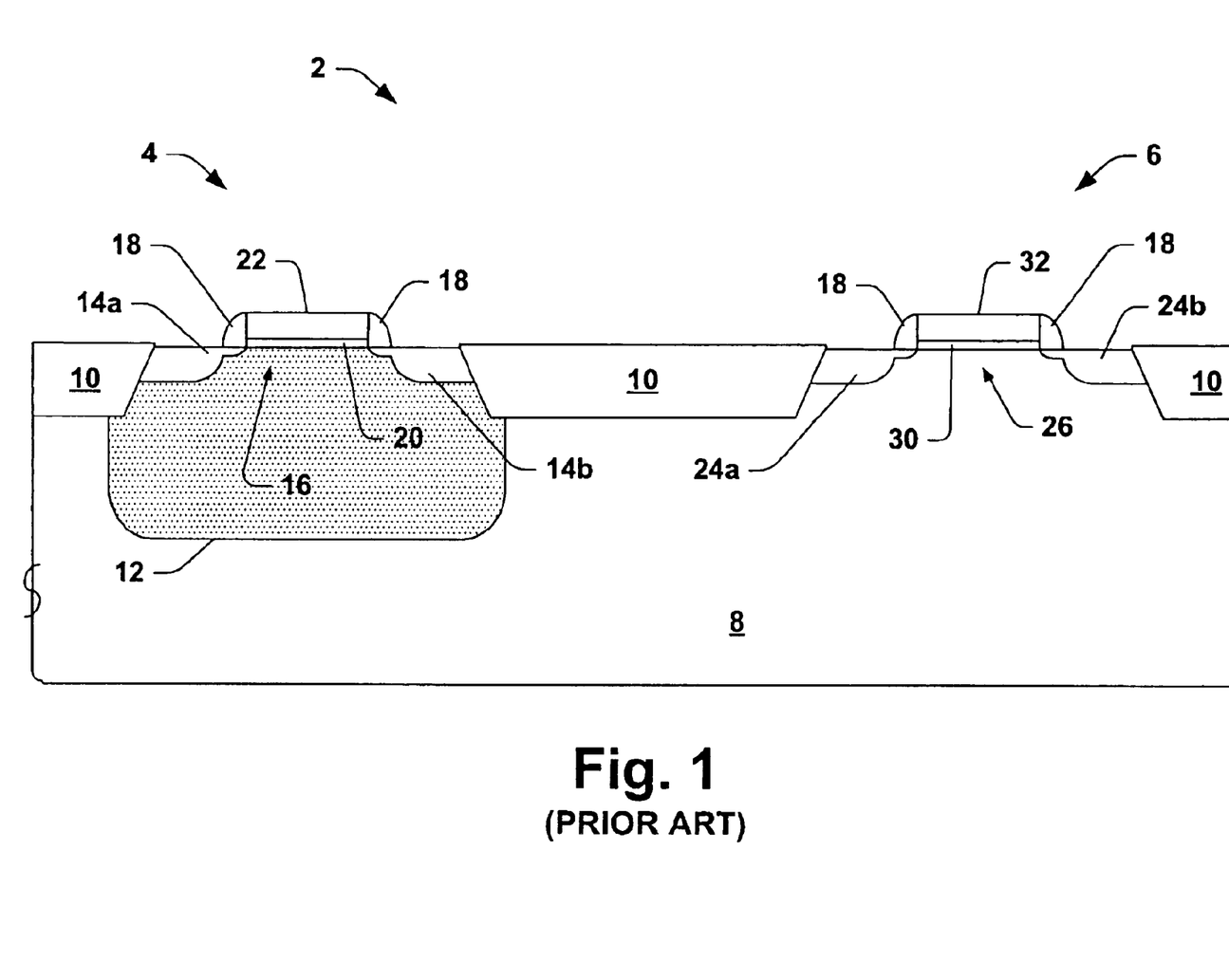
FIG. 1 is a partial side elevation view in section illustrating a conventional semiconductor device with NMOS and PMOS transistors.

By way of example, FIG. 1 illustrates a conventional complementary MOS (CMOS) device 2 with PMOS and NMOS type transistor devices 4 and 6, respectively, formed in or on a silicon substrate 8. Isolation structures 10, such as shallow trench (oxide) isolation structures (STI), are formed within the substrate 8 to electrically isolate the devices from one another as well as from other surrounding devices. For example, one or both of the transistors may be included as part of an integrated circuit or used in any other appropriate manner.

The substrate 8 in the above example is lightly doped p-type silicon with an n-well 12 formed therein under the PMOS transistor 4. The PMOS device 4 includes two laterally spaced p-doped source/drain regions 14a and 14b with a channel region 16 located therebetween in the n-well 12. A gate is formed over the channel region 16 comprising an $SiO_2$ gate dielectric 20 overlying the channel 16 and a conductive polysilicon gate contact structure 22 formed over the gate dielectric 20.

The NMOS device 6 includes two laterally spaced n-doped source/drain regions 24a and 24b outlying a channel region 26 in the substrate 8 (or alternatively a p-well region (not shown)) with a gate formed over the channel region 26 comprising an $SiO_2$ gate dielectric layer 30 and a polysilicon gate contact 32, where the gate dielectrics 20 and 30 may be patterned from the same oxide layer. Both the PMOS device 4 and the NMOS device 6 include sidewall spacers 18 that aid in doping the respective source/drain regions 14a, 14b and 24a, 24b.

Referring to the NMOS device 6, for example, the resistivity of the channel 26 may be controlled by the voltage applied to the gate contact 32, where changing the gate voltage changes the amount of current through channel 26. The gate contact 32 and the channel 26 are separated by the $SiO_2$ gate dielectric 30, which is an insulator. The gate dielectric, thus, allows little or no current to flow between the gate contact 32 and the channel 26. The gate dielectric 30 allows the gate voltage at the contact 32 to induce an electric field in the channel 26, by which the channel resistance can be controlled by the applied gate voltage.

MOSFET devices produce an output current proportional to the ratio of the width over the length of the channel (W/L), where the channel length is the physical distance between the source/drain regions (e.g., between regions 24a and 24b in the device 6) and the width runs perpendicular to the length (e.g., perpendicular to the page in FIG. 1A). Thus, scaling the NMOS device 6 to make the width narrower may reduce the device output current. Previously, this characteristic has been accommodated by decreasing the channel length and decreasing the thickness of gate dielectric 30, thus bringing the gate contact 32 doser to the channel 26.

Additionally, the thickness and dielectric constant of the gate dielectric layer 30 are typically chosen to create a gate capacitance appropriate for a particular use of the transistor 6, where the gate capacitance, among other things, controls the formation of the electrical field in channel region 26. The gate capacitance is directly proportional to the dielectric constant of gate dielectric layer 30 and inversely proportional to the thickness of gate dielectric layer 30. Therefore, as the other features of transistor 6 are scaled down, the thickness of gate dielectric layer 30 may also be scaled down proportionally to maintain an appropriate gate capacitance (assuming the dielectric constant of the material remains the same).

However, making the gate dielectric layer 30 thinner can have undesirable results, particularly where the gate dielectric 30 is $SiO_2$. One shortcoming of a thin $SiO_2$ gate dielectric 30 is increased gate leakage currents due to tunneling through the oxide 30. Additionally, since the films are literally formed from a few layers of atoms (monolayers), very precise process controls are required to uniformly and repeatably produce the layers. Uniform coverage is important because device parameters may change based upon the presence or absence of even a single monolayer of dielectric material. Also, a thin $SiO_2$ gate dielectric layer 30 provides a poor diffusion barrier to dopants. In this manner, boron, for example, may be allowed to penetrate into and contaminate the underlying channel region 16 during doping of an overlying poly-silicon gate.

Consequently, recent efforts involving MOSFET device scaling have focused on alternative dielectric materials that can be made thicker than scaled silicon dioxide layers and yet still produce the same field effect performance. These materials are often referred to as high-k materials because their dielectric constants are greater than that of $SiO_2$, (which is about 3.9). The relative performance of such high-k materials is often expressed as equivalent oxide thickness (EOT), because, while the alternative layer may be thicker, it still provides the equivalent electrical effect of a much thinner layer of $SiO_2$.

Accordingly, high-k dielectric materials can be utilized to form gate dielectrics, where the high-k materials facilitate a reduction in device dimensions while maintaining a consistency of desired device performance. By way of example, conventional gate dielectrics (e.g., of silicon oxide ($SiO_2$)) can have thicknesses of about 1–3 nanometers, whereas high-k gate dielectrics have thicknesses on the order of 2–10 times greater, yet exhibit comparable electrical performance to the thinner $SiO_2$. The larger thickness tends to minimize leakage through the gate dielectric, among other things.

Figure 2:
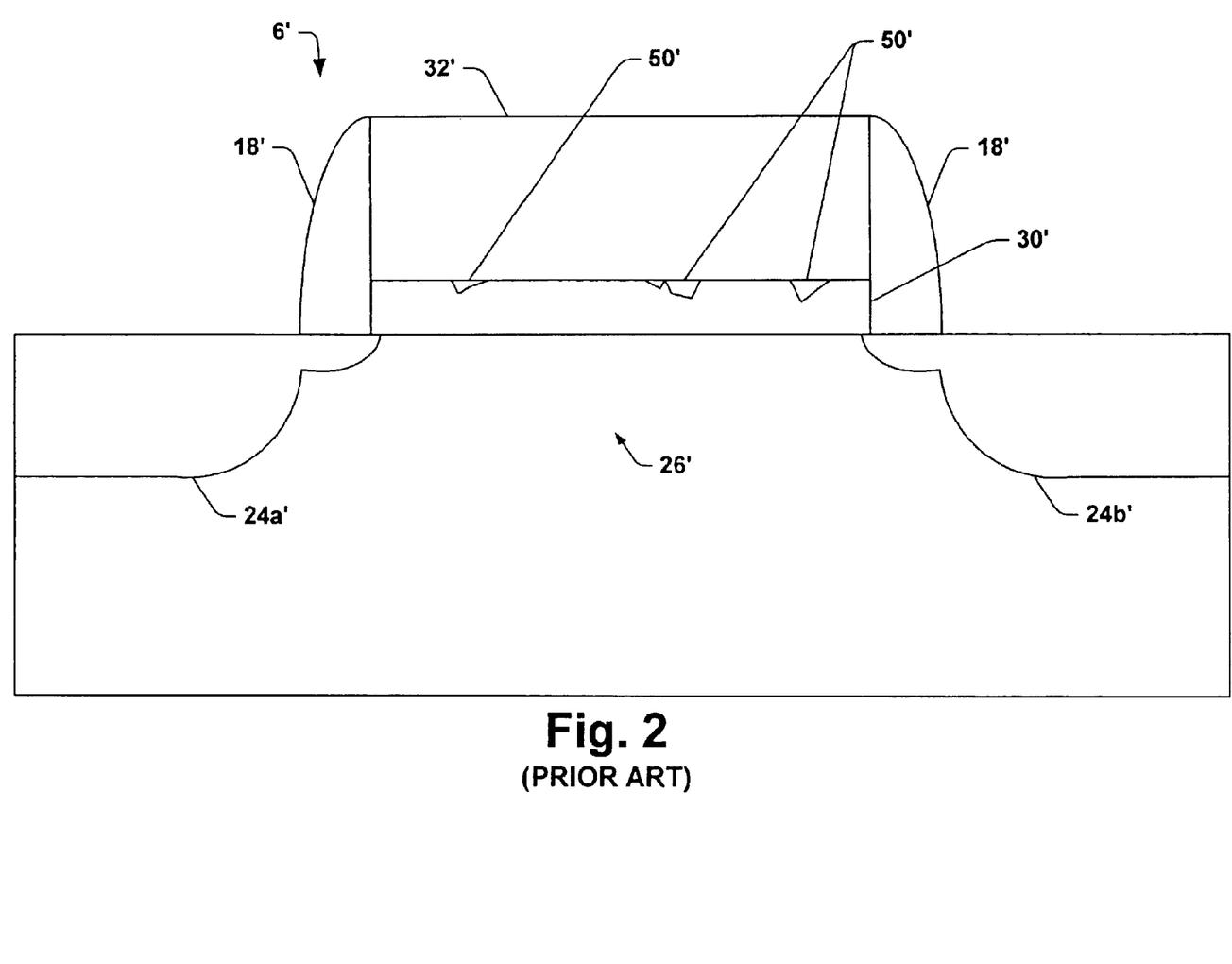
FIG. 2 is a partial side elevation view in section illustrating point defects in a high-k dielectric in a proposed gate structure of a transistor.

Referring to FIG. 2, one proposed alternative structure is illustrated, in which a high-k gate dielectric material 30' is used to form a gate dielectric layer in an NMOS device 6'. A conductive gate electrode structure 32' is formed over the high-k dielectric layer 30'. While such a high-k dielectric layer 30' assists in mitigating of some of the issues encountered with device scaling, other issues may persist, however. For example, hydrogen and/or hydrogen containing compounds are commonly utilized in many of the stages of semiconductor fabrication, and hydrogen can react with high-k dielectric materials such as hafnium oxide and adversely affect the construction and/or electrical properties thereof.

Hydrogen based precursors, such as $SiH_4$, for example, are used extensively in producing epitaxial silicon, polycrystalline silicon and certain dielectrics, such as $Si_3N_4$ and $SiO_2$. These fabrication processes expose the high-k dielectrics to high concentrations of hydrogen which can etch, embrittle or otherwise react with the high-k dielectric materials to reduce or otherwise adversely affect the high-k materials. Additionally, atomic hydrogen (e.g., H) is often produced in semiconductor fabrication processes as certain (transition) metals utilized in the process are known to "crack" hydrogen gas ($H_2$). Atomic hydrogen is a strong etchant of silicon and silicon based compounds, and thus may undesirably reduce many high-k dielectric materials.

Hydrogen can thus reduce the high-k dielectric 30' and can also create point defects 50' therein. Such defects 50' can counteract or negate some of the positive aspects of high-k materials by potentially reducing the electrical thickness of the high-k material 30' and increasing the leakage path through the high-k dielectric at these defects, thus leading to the aforementioned issues at the contaminated locations 50'. Such defects can also serve as sinks or reservoirs for dopants and/or other electrically active impurities that can fill in the defects 50' and degrade the electrical properties of the dielectrics, including the reliability thereof.

Further, such defects 50' disrupt the uniformity of the high-k dielectric material 30' which can adversely affect the operation of the transistor 6' by, among other things, disrupting electromagnetic fields that are developed between the gate electrode 32' and the source 24a', drain 24b' and/or channel 26' regions of the transistor when a bias voltage is applied to the gate electrode 32'. This affects the current flowing through the transistor 6' (e.g., $I_{on}-I_{off}$), among other things. It will be appreciated that the defects 50' depicted in FIG. 2 are merely illustrative and that such defects may have a significantly different physical manifestation in reality.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to forming a transistor in the absence of hydrogen, or in the presence of a significantly reduced amount of hydrogen. In this manner, a high-k material can be utilized to form a gate dielectric layer in the transistor and facilitate device scaling while mitigating defects that can be introduced into the high-k material by the presence of hydrogen and/or hydrogen containing compounds.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, that one or more aspects of the present invention may be practiced with a lesser degree of these specific details. In other instances, well-known structures and devices are shown in block diagram form in order to facilitate describing one or more aspects of the present invention.

The present invention pertains to forming a transistor in the absence of or in the presence of a significantly reduced amount of hydrogen. In this manner, a high-k material can be utilized to form a gate dielectric layer in the transistor and facilitate device scaling while mitigating defects that can be introduced into the high-k material by the presence of hydrogen and/or hydrogen containing compounds.

Figure 3:
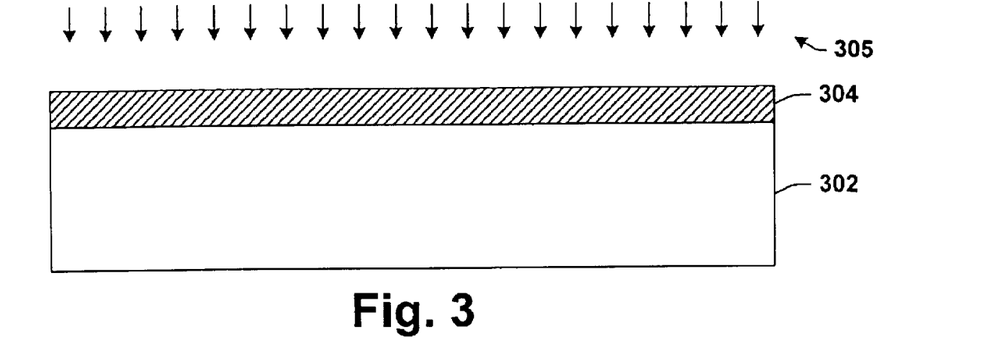
FIGS. 3–16 are cross-sectional illustrations of a transistor formed in accordance with one or more aspects of the present invention.

FIGS. 3–8 are provided below to illustrate various stages of fabrication of a semiconductor device formed in accordance with one or more aspects of the present invention. The device is fabricated in the absence of hydrogen to mitigate defects encouraged thereby. As a result, the device has a greater reliability than conventionally formed devices. The stages are provided to illustrate exemplary structures and fabrication techniques that can be implemented in accordance with one or more aspects of the present invention. It is to be appreciated, however, that suitable variations are contemplated herein and that such variations are deemed to be in accordance with one or more aspects of the present invention Initially, a semiconductor substrate 302 has a layer of high-k gate dielectric material 304 applied 305 there-across in the absence of hydrogen (FIG. 3). It is to be appreciated that the term "semiconductor substrate" as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

Examples of high-k materials that may be used for the gate dielectric layer 304 include, but are not limited to, zirconium silicon oxides, hafnium silicon oxides, aluminum oxide, yttrium oxide, yttrium-silicon-oxides, lanthanum oxide, lanthanum silicon oxides, zirconium aluminate, hafnium aluminate, lanthanum aluminate, aluminum nitride, tantalum oxide, titanium oxide, zirconium oxide, hafnium oxide, zirconium oxynitride, hafnium oxynitride, zirconium silicon oxynitride, and hafnium silicon oxynitride. Any other appropriate high-k dielectric materials may also be used.

It will be appreciated that high-k dielectric materials are generally understood to mean materials having a dielectric constant higher than that of silicon dioxide (which is about 3.9). A dielectric material having a k of about 7.8 and a thickness of about 10 nm, for example, is substantially electrically equivalent to an oxide gate dielectric having a k of about 3.9 and a thickness of about 5 nm. It will also be appreciated that the layer of high-k gate dielectric material 304 can be formed 305 across the substrate 302 in any of a number of suitable manners, including, for example, sputtering techniques (e.g., magnetron or ion beam sputtering), chemical vapor deposition (CVD), atomic layer deposition (ALD), etc.

Figure 4:
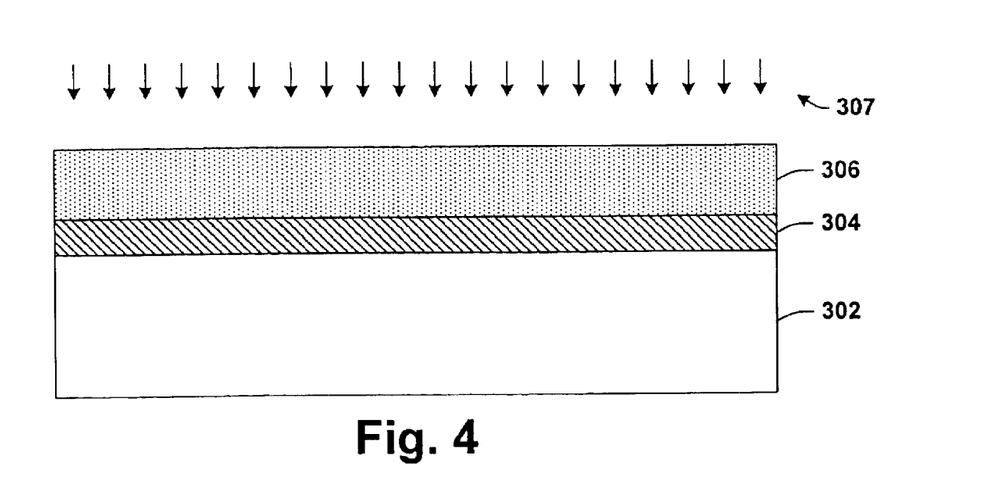

A gate electrode layer 306 is then applied 307 over the layer of high-k gate dielectric material 304 (FIG. 4). The gate electrode layer 306 ultimately yields a contact area or surface that provides a means for applying a voltage to the transistor 300 or otherwise biasing the transistor 300. The gate electrode layer 306 generally includes doped polysilicon, silicon germanium (SiGe) or metal, and can be formed to a thickness of about 200 nanometers or less, for example. A layer of poly-silicon or silicon germanium can be formed via sputtering, chemical vapor deposition (CVD), physical vapor deposition (PVD), molecular beam epitaxy (MBE), atomic layer deposition (ALD) or evaporation, for example, to form the gate electrode layer 306.

In accordance with one or more aspects of the present invention, the gate electrode layer 306 is formed in the absence of hydrogen, or in the presence of a significantly reduced amount of hydrogen (or hydrogen containing compounds). Poly-silicon can, for example, be formed via CVD in the presence of silicon tetrafluoride(SiF4), silicon tetrachloride(SiCl4) and/or silicon tetra iodide (SiI4). Poly-silicon can similarly be formed in a plasma environment containing argon and/or xenon. A metal gate (e.g., titanium nitride, tantalum silicon nitride, titanium aluminum nitride) can also be formed via CVD using inorganic precursors or using any suitable physical vapor deposition processes (PVD). Since atomic hydrogen can effectively, albeit undesirably, etch high-k materials resulting in point defects, and since some metals can crack molecular hydrogen to form atomic hydrogen, care is taken when metal gates are formed to mitigate the formation of atomic hydrogen.

Figure 5:
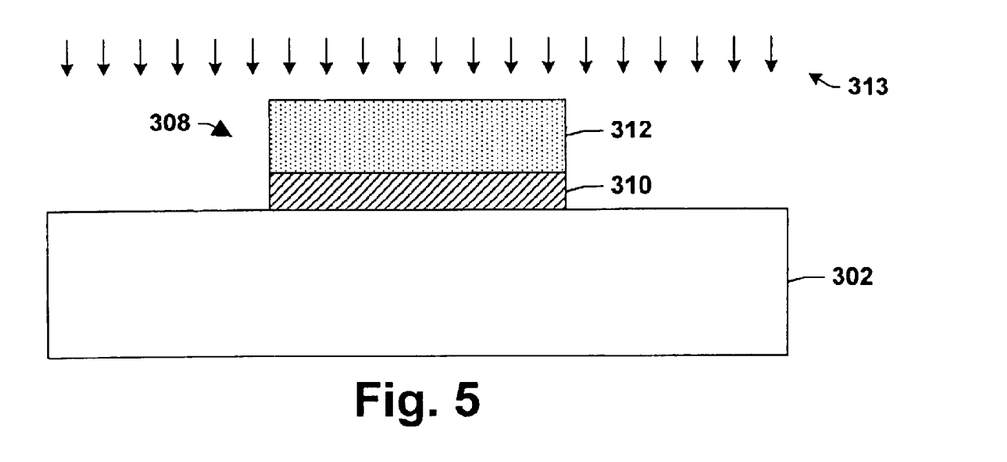

The gate electrode layer 306 and the layer of gate dielectric material 302 are then patterned to form a gate structure 308 (FIG. 5). The gate structure 308 thus comprises a gate dielectric 310 and a gate electrode 312. It will be appreciated that the gate dielectric 210 and gate electrode 312 are patterned in the absence of hydrogen, or in the presence of a significantly reduced amount of hydrogen (or hydrogen containing compounds) to mitigate altering or damaging the high-k material. For example, an etch chemistry of non-hydrogen containing flurocarbons or chlorocarbons plus oxygen can be applied 313 to layers 304, 306 to form the gate dielectric 310 and gate electrode 312. Examples of such etch chemistries include, but are not limited to, $CF_2$, $CF_4$, $C_2F_6$, $C_4F_6$, $C_4F_8$, $CCl_4$, $ClF_3$, $NF_3$ and $SF_6$. In addition, CO or $CO_2$ may be employed in place of, or in addition to, $O_2$ to tune the selectivity of the etch. Etch chemistries of Si, $SiO_2$ and $Si_3N_4$ can also be utilized to etch the gate dielectric 310 and gate electrode 312, for example. Such chemistries may not, however, be optimized for selectivity. Additionally, the etching of the high-k gate dielectric 310 is done at a temperature that is elevated relative to that of the gate electrode 312. For example, the gate electrode layer may be etched at a temperature of less than about 100 C (e.g., around 50–70 C), while the high-k dielectric layer may be etched at a temperature range of about 200–400 C. A wet etch may also, however, be utilized to etch the gate dielectric 310. For example, supercritical flurocarbons and chlorocarbons may be employed in such a wet etch. It will be appreciated that such chemistries can also be utilized to etch subsequently applied oxide and nitride layers, discussed below.

Figure 6:
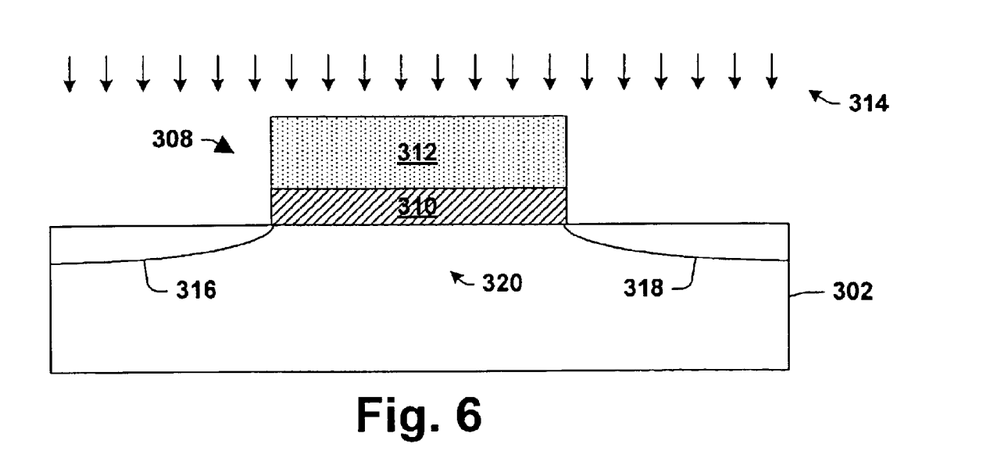

After the gate structure 308 is formed, a dopant 314 is applied to the substrate 302 to form source and drain extension regions 316, 318 therein (FIG. 6). Such extension regions may, for example, be formed according to HDD (highly doped drain) techniques in the absence of hydrogen. The extension regions abut a channel region 320 within the substrate 302 under the gate structure 308 and facilitate absorption of some of the potential associated with the drain. In this manner, some of this potential is directed away from the drain/channel interface, thereby mitigating the occurrence of hot carriers and the adverse affects associated therewith.

By way of example, a p-type dopant (e.g., boron) having a concentration of about 1E19 to 5E20 atoms/cm$^3$ for a PMOS transistor, or an n-type dopant (e.g., phosphorous) having concentration of about 1E19 to 9.5E20 atoms/cm$^3$ for an NMOS transistor can be implanted to a depth of about 300–350 Angstroms, for example, to establish the extension regions 316, 318. It will be appreciated, however, that other implant concentrations and penetration depths are contemplated by the present invention, as are additional implantation acts (e.g., to form halo regions—not shown).

Figure 7:
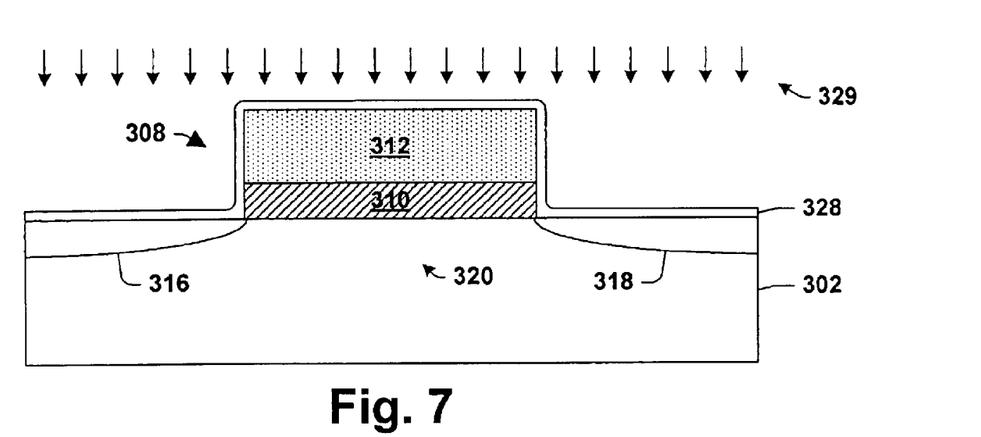
Figure 8:
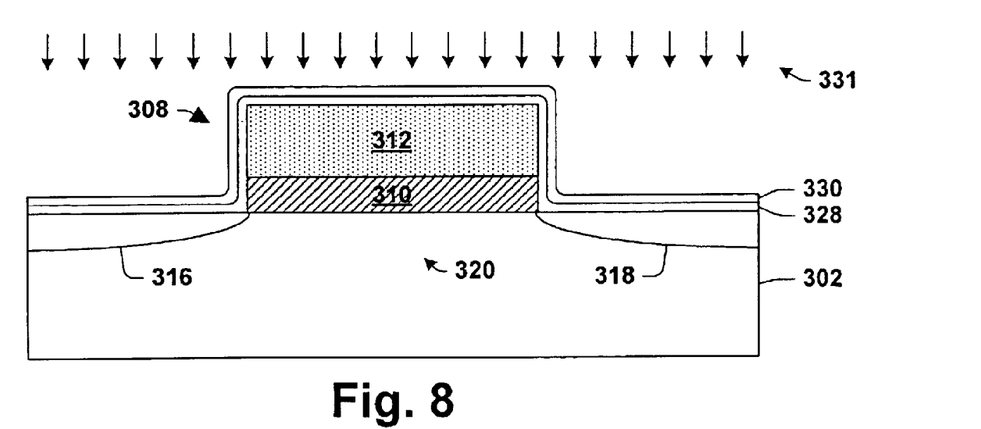
Figure 9:
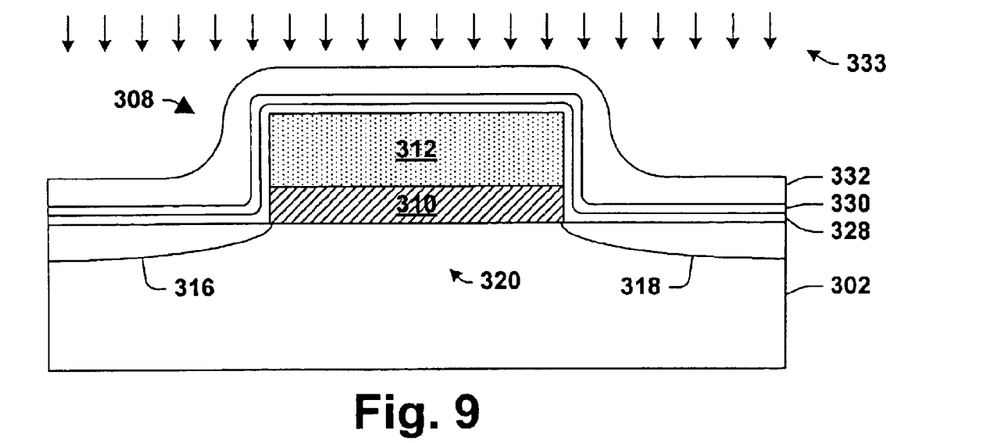

A first oxide layer 328 (e.g., $SiO_2$) is then applied 329 to the gate structure 308 and exposed portions of the substrate 302 (FIG. 7). The first oxide layer 328 can be formed to a thickness of about 10 to 30 Angstroms, for example. The first oxide layer 328 is sometimes referred to a liner oxide and can, for example, be formed utilizing $SiF_4$, $SiCl_4$, $SiBr_4$ or $SiI_4$ plus oxygen. A nitride layer 330 is then applied 331 over the first oxide layer 328 (FIG. 8), and a second spacer oxide layer 332 is applied 333 over the nitride layer 330 (FIG. 9).

The nitride layer 330 can be formed to a thickness of about 50 to 80 Angstroms and the second oxide layer 332 can be formed to about 400 to 800 Angstroms, for example. It will be appreciated that the first oxide layer 328, the nitride layer 330 and the second oxide layer 332 can be formed in any number of suitable ways in the absence of hydrogen, such as chemical vapor deposition (CVD), for example. The layers may, for example, be formed in an environment of $SiF_4$, $SiCl_4$, $SiBr_4$, $SiI_4$, or TEOS plus oxygen or $SiF_4$, $SiCl_4$, $SiBr_4$ or $SiI_4$ plus nitrogen plasma for silicon dioxide and silicon nitride, respectively. $SiO_2$ and $Si_3N_4$ can, for example, also be deposited with non-hydrogen containing precursors, such as oxygen containing compounds and/or deuterated precursors. These processes can be performed at sub-atmospheric pressure (100's of Torr to mTorr) and at reduced temperatures (<700° C.).

Figure 10:
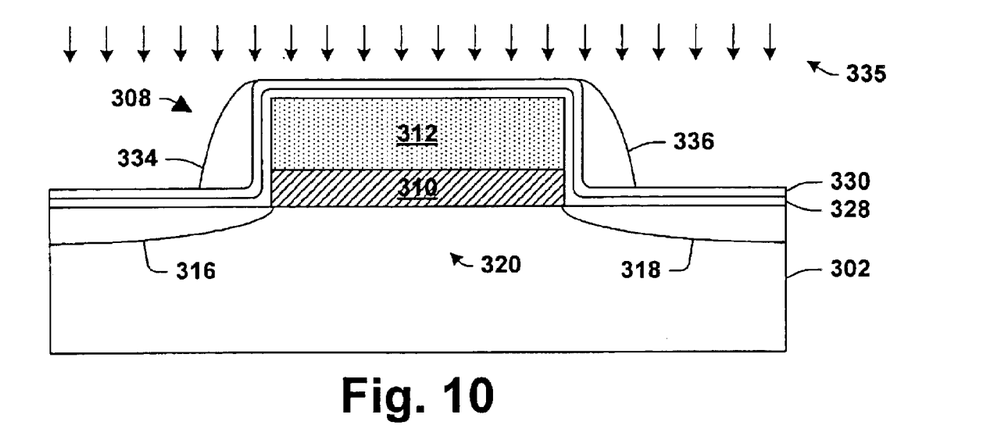

The second oxide layer 332 is then processed 335 (e.g., via dry etching or other suitable reduction techniques) in the absence of hydrogen to reveal oxide sidewall spacers 334, 336 adjacent to the gate structure 308 (FIG. 10). Such sidewall spacers can have a width of about 300 to 700 Angstroms, for example. It will be appreciated that this processing is substantially selective such that the underlying nitride layer 330 is generally unaffected by the processing.

Figure 11:
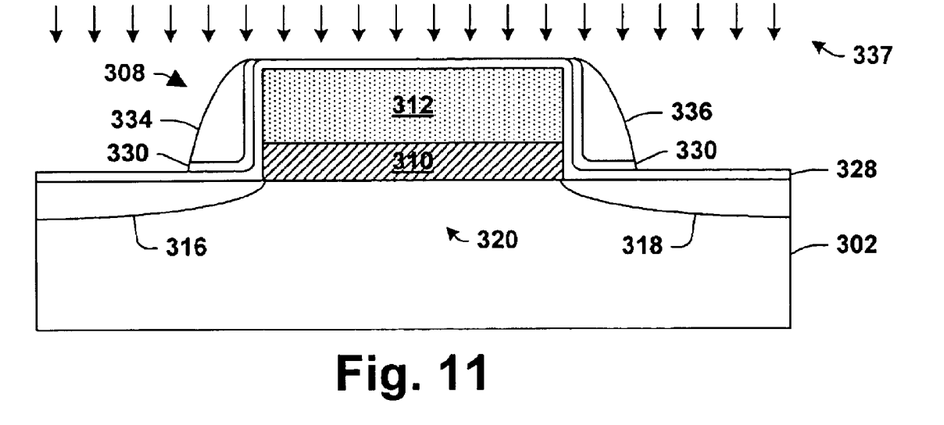

The nitride layer 330 is then processed 337 (e.g., etched) in the absence of hydrogen to remove nitride material not covered/protected by the oxide sidewall spacers 334, 336 (FIG. 11). In the example shown the remaining or residual nitride material 330 has an "L" shape. It will be appreciated that this processing is also substantially selective such that the oxide sidewall spacers 334, 336 are generally not affected thereby.

Figure 12:
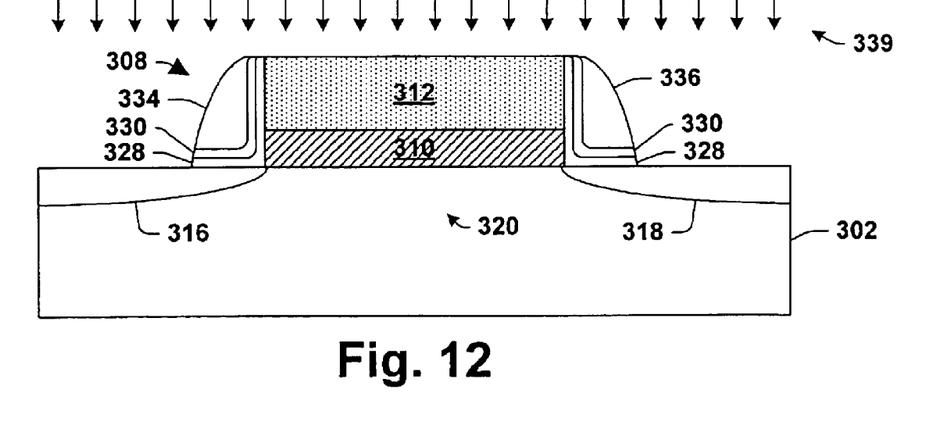

A portion of the remaining oxide material 328 is subsequently processed 339 (e.g., etched) in the absence of hydrogen to remove some or all of the exposed portions of the first oxide layer 328 (FIG. 12). Again, this processing is substantially selective such that the remaining (L shaped) nitride material 330 is not affected thereby. In this manner, portions of the first oxide layer 328 underlying the residual nitride material 330 are not affected by the processing. It will be appreciated that variations in the height and/or other dimension(s) of the features 330, 334, 336 depicted in the Figs. is merely incidental and/or the result of intermediate acts that are generally understood, but that are not shown or described herein.

Figure 13:
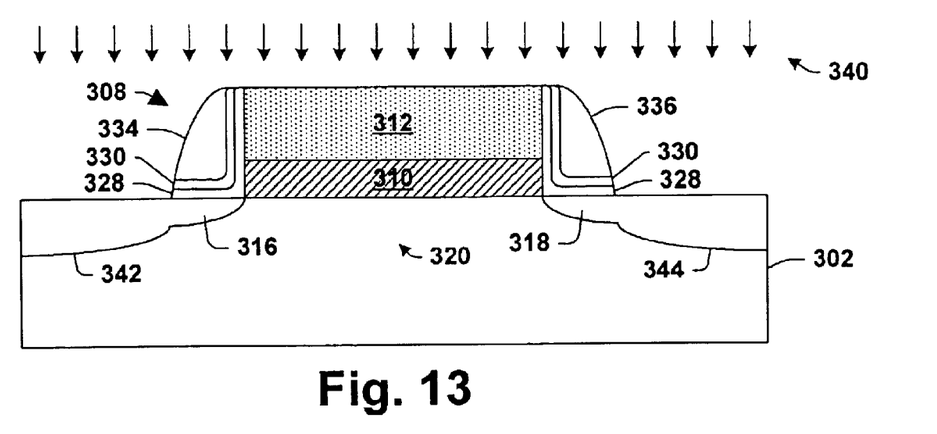

Additional dopant 340 is then implanted in the absence of hydrogen to form source and drain regions 342, 344 adjacent to the channel 320 (FIG. 13). These implants are done at relatively low energies and are substantially blocked by the sidewall spacers 334, 336 and the residual nitride material 330. Accordingly, the sidewall spacers 334, 336 and residual nitride material 330 together act as a boundary that guides the dopants 340 in forming the source and drain regions 342, 344 in the substrate 302. By way of example, a dopant of Arsenic or other suitable substance having a concentration of about 5E19 to 5E20 atoms/$cm^3$ may be implanted at an energy level of about 20 to 50 KeV to provide dopant into silicon to about 300–350 Angstroms to form the source and drain regions 342, 344. It will be appreciated, however, that other implant concentrations, energy levels and/or penetration depths are contemplated as falling within the scope of the present invention.

Figure 14:
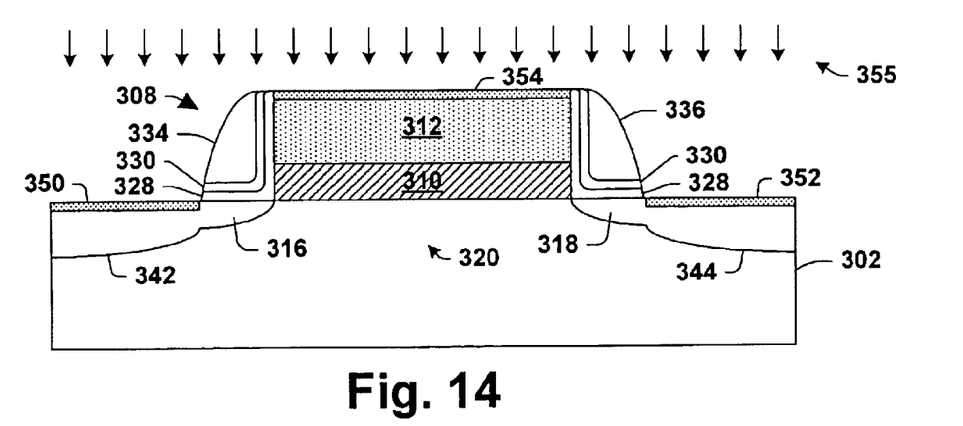

Upper surfaces 350, 352, 354 of the substrate 302 and the gate electrode 312, respectively, that are exposed are then salicided (FIG. 14). More particularly, a metal 355 is deposited in a non-hydrogen atmosphere. An annealing process may, for example, also be performed in forming these contacts 350, 352, 354, with the un-reacted metal being stripped. Such strips are performed using wet chemistries that do not contain hydrogen with sufficient activity to affect the high-k dielectric, such as supercritical flurocarbons and chlorocarbons.

Figure 15:
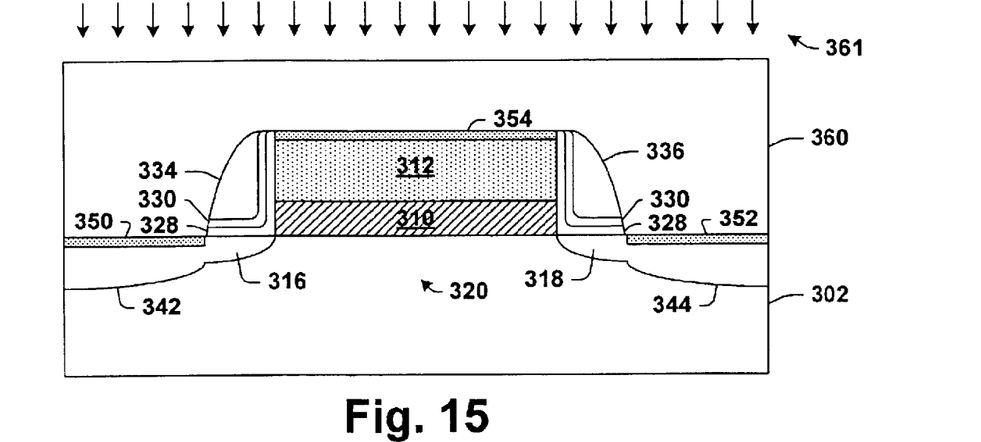
Figure 16:
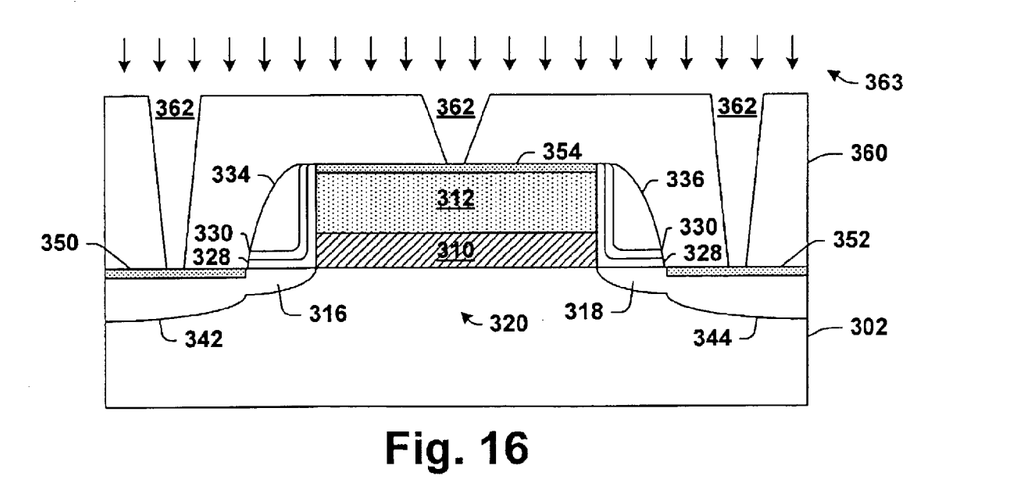

A layer of nitride material 360 or other pre-metal dielectric (PMD) is then applied 361 over the gate structure 308 and the salicided regions of the substrate 302 in the absence of hydrogen (FIG. 15). This silicon nitride layer can be deposited by PECVD using $SiF_4$, $SiCl_4$, $SiBr_4$ or $SiI_4$ and nitrogen, for example. Vias 362 are then formed within the layer of nitride material 360, such as by selectively applying one or more non-hydrogen containing etchants 363 such as non-hydrogen containing flurocarbons or chlorocarbons plus oxygen (FIG. 16).

The vias can be filled with a conductive material to provide an electrical connection to the gate 308 and the source and drain of the transistor 342, 344.

It will be appreciated that the ordering of the stages as set forth herein is not meant to be absolute, and that such ordering can be rearranged, and that any such rearrangement is contemplated as falling within the scope of the present invention. For example, the source 342, drain 344 and extension regions 316, 318 can be formed before or after any of the first oxide 328, nitride 330 or second oxide 332 layers are formed.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application.

Furthermore, to the extent that the terms "includes", "having", "has", "with", or variants thereof are used in either the detailed description or the claims, such terms are intended to be inclusive in a manner similar to the term "comprising."

What is claimed is:

1. A method of processing a transistor gate structure formed upon a semiconductor substrate having a high-k gate dielectric, comprising:

forming a first oxide layer over the gate structure and portions of the substrate adjacent to the gate structure not covered by the gate structure in the absence of hydrogen or hydrogen containing compounds;

forming a nitride layer over the first oxide layer in the absence of hydrogen or hydrogen containing compounds;

forming a second oxide layer over the nitride layer in the absence of hydrogen or hydrogen containing compounds;

etching the second oxide layer in the absence of hydrogen or hydrogen containing compounds to form sidewall spacers adjacent to the gate structure;

etching the nitride layer in the absence of hydrogen or hydrogen containing compounds; and etching the first oxide layer in the absence of hydrogen or hydrogen containing compounds.

2. The method of claim 1, wherein the first oxide layer is formed to a thickness of about 10 to 30 Angstroms.

3. The method of claim 1, wherein the first oxide layer is formed utilizing at least one of $SiCl_4$, $SiF_4$, $SiBr_4$ or $SiI_4$ plus oxygen.

4. The method of claim 1, wherein the nitride layer is formed to a thickness of about 50 to 80 Angstroms.

5. The method of claim 1, wherein the second oxide layer is formed to a thickness of about 400 to 800 Angstroms.

6. The method of claim 1, wherein at least one of the first oxide layer and the second oxide layer is formed in an environment of $SiF_4$, $SiCl_4$, $SiBr_4$, or $SiI_4$ plus oxygen.

7. The method of claim 1, wherein the nitride layer is formed in an environment of $SiF_4$, $SiCl_4$, $SiBr_4$ or $SiI_4$ plus nitrogen plasma.

8. The method of claim 1, wherein at least one of the first oxide layer, the nitride layer and the second oxide layer is formed under a pressure of less than 100 Torr.

9. The method of claim 1, wherein at least one of the first oxide layer, the nitride layer and the second oxide layer is formed under a temperature of less than 700° C.

10. The method of claim 1, wherein at least one of the first oxide layer, the nitride layer and the second oxide layer is formed by at least one of chemical vapor deposition (CVD), physical vapor deposition (PVD), plasma enhanced chemical vapor deposition (PECVD), molecular beam epitaxy (MBE), atomic layer deposition (ALD) and evaporation.

11. The method of claim 1, wherein at least one of the first oxide layer, the nitride layer and the second oxide layer are etched with a fluorocarbon or a chlorocarbon, along with $O_2$, CO or $CO_2$.

12. The method of claim 11, wherein etching with a fluorocarbon or a chlorocarbon comprises etching with one of $CF_2$, $CF_4$, $C_2F_6$, $C_4F_6$, $C_4F_8$, $CCl_4$, $ClF_3$, $NF_3$, $SF_6$.

13. The method of claim 1, wherein at least one of the first oxide layer, the nitride layer and the second oxide layer are etched with a wet etch chemistry not having hydrogen associated therewith.

14. The method of claim 13, wherein the wet etch chemistry comprises a supercritical fluorocarbon or a supercritical chlorocarbon.

15. The method of claim 1, wherein the sidewall spacers have respective widths of about 300 to 700 Angstroms.

16. The method of claim 1, wherein the second oxide layer protects underlying portions of the nitride layer such that the remaining portions of the nitride layer are substantially "L" shaped.

17. The method of claim 1, further comprising:

saliciding exposed top portions of the substrate and the gate structure in the absence of hydrogen or hydrogen containing compounds.

18. The method of claim 17, wherein unreacted metal for saliciding is removed with a wet etch chemistry comprising a supercritical fluorocarbon or a supercritical chlorocarbon.

19. The method of claim 17, further comprising:

forming a second layer of nitride material over the gate structure and salicided portions of the substrate in the absence of hydrogen or hydrogen containing compounds;

forming vias within the second layer of nitride material down to the salicides to allow electrical connections to be made to the gate structure and source and drain regions of the transistor.

20. The method of claim 19, wherein the second layer of nitride material is formed via chemical vapor deposition (CVD) using $SiCl_4$, $SiF_4$, $SiBr_4$ or $SiI_4$ plus nitrogen.

21. The method of claim 19, wherein the vias are formed by way of selectively etching the second layer of nitride material with non-hydrogen containing flurocarbons or chlorocarbons plus oxygen.

22. The method of claim 19 further comprising:

filling the vias with a conductive material to establish the electrical connections.

23. A method of processing a transistor gate structure formed upon a semiconductor substrate having a high-k gate dielectric, comprising:

forming a nitride layer between a first oxide layer and a second oxide layer wherein at least one of the first oxide layer and the second oxide layer includes $SiO_2$ and is formed utilizing deuterated precursors;

etching the second oxide layer in the absence of hydrogen or hydrogen containing compounds to form sidewall spacers adjacent to the gate structure;

etching the nitride layer in the absence of hydrogen or hydrogen containing compounds; and etching the first oxide layer in the absence of hydrogen or hydrogen containing compounds.

24. A method of processing a transistor gate structure formed upon a semiconductor substrate having a high-k gate dielectric, comprising:

forming a first oxide layer over the gate structure and portions of the substrate adjacent to the gate structure not covered by the gate structure in the absence of hydrogen or hydrogen containing compounds;

forming a nitride layer over the first oxide layer wherein the nitride layer includes $Si_3N_4$ and is formed utilizing deuterated precursors;

forming a second oxide layer over the nitride layer in the absence of hydrogen or hydrogen containing compounds;

etching the second oxide layer in the absence of hydrogen or hydrogen containing compounds to form sidewall spacers adjacent to the gate structure;

etching the nitride layer in the absence of hydrogen or hydrogen containing compounds; and etching the first oxide layer in the absence of hydrogen or hydrogen containing compounds.

* * * * *